United States Patent [19]
Fang et al.

[11] Patent Number: 5,670,414
[45] Date of Patent: Sep. 23, 1997

[54] GRADED-GAP PROCESS FOR GROWING A SIC/SI HETEROJUNCTION STRUCTURE

[75] Inventors: Y. K. Fang; J. D. Hwang, both of Tainan, Taiwan

[73] Assignee: National Science Council, Taipei, Taiwan

[21] Appl. No.: 596,027

[22] Filed: Feb. 6, 1996

[51] Int. Cl.[6] .................................................. H01L 21/20
[52] U.S. Cl. .................... 437/100; 257/77; 148/DIG. 148
[58] Field of Search .............................. 437/100; 257/77, 257/19; 148/DIG. 148

[56] References Cited

U.S. PATENT DOCUMENTS

| | | | |
|---|---|---|---|
| 4,912,064 | 3/1990 | Kong et al. | 437/100 |
| 4,933,300 | 6/1990 | Koinuma et al. | 437/100 |
| 5,225,032 | 7/1993 | Golecki | 437/100 |
| 5,238,866 | 8/1993 | Bolz et al. | 437/100 |
| 5,362,684 | 11/1994 | Saito et al. | 437/100 |
| 5,366,713 | 11/1994 | Sichanugrist et al. | 437/100 |
| 5,390,626 | 2/1995 | Nagasawa et al. | 437/100 |
| 5,445,992 | 8/1995 | Tokunaga et al. | 437/100 |

*Primary Examiner*—Charles L. Bowers, Jr.
*Assistant Examiner*—Ramamohan Rao Paladugo
*Attorney, Agent, or Firm*—Christie, Parker & Hale, LLP

[57] ABSTRACT

The present invention relates to a graded-gap process for forming a SiC/Si heterojunction electrical element and includes steps of a) provide a Si substrate; b) introduce a hydrogen containing gas stream to the Si substrate; c) introduce a silane-containing gas stream of a constant flow rate to the Si substrate for reacting with the hydrogen-containing gas stream for a first period of time; d) introduce an alkanes-containing gas stream of a gradually changing flow rate to the Si substrate for reacting with the hydrogen-containing gas stream and the silane-containing gas stream to grow a SiC layer on the Si substrate for a second period of time; and e) introduce the alkanes-containing gas stream at a constant flow rate for reacting with the hydrogen-containing gas stream and the silane-containing gas stream for a third period of time. Such process can grow an excellent graded band-gap SiC/Si heterojunction diode with low cost.

16 Claims, 6 Drawing Sheets

GRADED-GAP PROCESS FOR GROWING A SIC/SI HETEROJUNCTION STRUCTURE

FIELD OF THE INVENTION

The present invention relates to a process for forming a SiC/Si heterojunction, especially to a graded-gap process for growing a SiC layer on a Si substrate to form a SiC/Si heterojunction diode.

BACKGROUND OF THE INVENTION

A SiC/Si heterojunction diode is well recognized as an excellent electrical element applied in high temperature, high power and high frequency devices. It has several advantages such as:

1) wide band-gap (β-SiC, Eg=2.2 eV);
2) large saturated drift velocity ($2.5 \times 10^7$ cm/s);
3) large thermal conductivity (5 W/cm °C.)
4) excellent refractory and radiation resistance; and
5) capability of being used with VLSI.

Thus, the SiC/Si heterojunction electrical elements are going to take the places of those made by III–V group materials.

The conventional method to form a SiC/Si heterojunction is the carbonization having steps as described below:

Step A: provide a washed P type Si substrate which has a resistance coefficient of 3–5 Ω-cm. Remove the surface oxide of the Si substrate in a chemical vapor deposition (C.V.D.) system under a highly vacuumed surrounding having a pressure under $10^{-6}$ Torr and a temperature of 900° C. for about 10 minutes;

Step B: introduce $H_2$ and $C_3H_8$ gases to the Si substrate, and carbonize the surface of the P type Si substrate with the $C_3H_8$ gas under a temperature of 1200° C. to form a SiC layer serving as a buffer layer; and Step C: heat the substrate to 1150° C. and introduce $H_2$, $C_3H_8$, and $SiH_4$ gas stream for 10 minutes to grow a SiC layer which is an N type pure SiC layer. Thus, a SiC/Si heterojunction diode is obtained.

Figure 1:
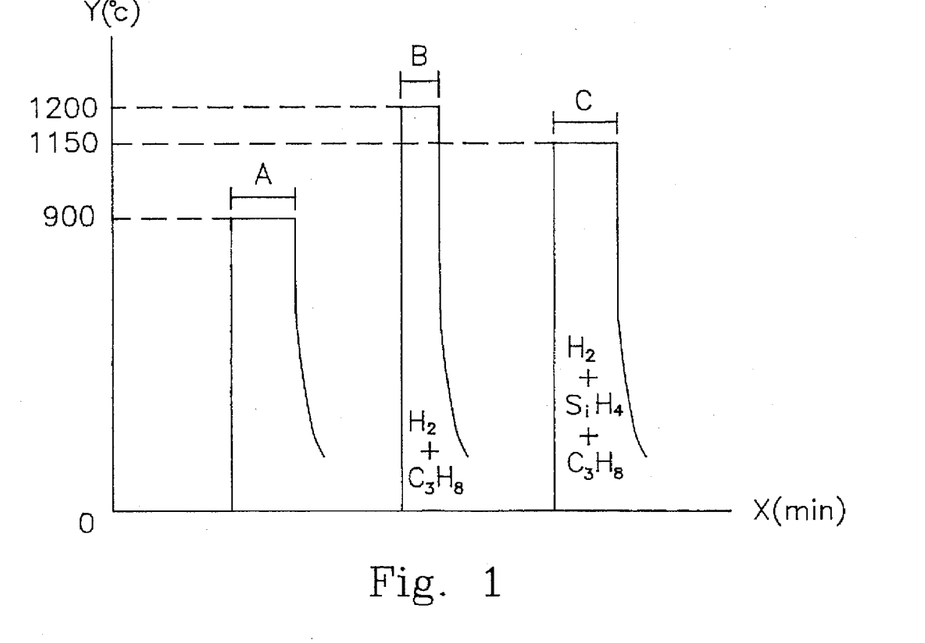
FIG. 1 is a plot of temperature vs. processing time in forming a SiC/Si heterojunction by a conventional carbonization process.

FIG. 1 is an illustration of the relationship between time and temperature for the conventional carbonization process, wherein labels A, B, and C respectively represent step A, B and C described above.

However, the lattice constant and expansion constant differences between SiC and Si are 20% and 8% respectively, which cause many defects in the SiC/Si heterojunction formed in the conventional carbonization process:

1) when reversely biased, a SiC/Si diode will have an increased current which lowers the breakdown voltage; and
2) the heterojunction will significantly exist thereon phenomena of void, dislocation and crack.

Moreover, the bulk SiC is very expensive since there requires a carbonization process upon manufacturing. Owing to the reasons described above, the application of the SiC/Si heterojunction electrical elements has been greatly retarded.

Thus, it is attempted by the applicants to solve these problems.

SUMMARY OF THE INVENTION

A purpose of the present invention is to provide a SiC/Si heterojunction diode with excellent interface properties.

The other purpose of the present invention is to simplify the process for forming a SiC/Si heterojunction to reduce the cost and the processing time.

The graded-gap process according to the present invention for forming a SiC/Si heterojunction electrical element includes a) provide a Si substrate; b) introduce a hydrogen containing gas stream to the Si substrate; c) introduce a silane-containing gas stream of a constant flow rate to the Si substrate for reacting with the hydrogen-containing gas stream for a first period of time; d) introduce an alkanes-containing gas stream of a gradually changing flow rate to the Si substrate for reacting with said hydrogen- containing gas stream and the silane-containing gas stream to grow a SiC layer on the Si substrate for a second period of time; and e) introduce the alkanes-containing gas stream at a constant flow rate for reacting with the hydrogen-containing gas stream and the silane-containing gas stream for a third period of time. Wherein the step c), d) and e) are executed at a constant temperature which is preferred to be 1150° C.

The substrate preferably has a surface oxide thereof been removed before the hydrogen-containing gas stream is introduced.

The surface oxide is preferably removed in a chemical vapor deposition (C.V.D.) system or a rapid thermal C.V.D. (R.T.C.V.D.) system under a pressure of about $10^{-6}$ Torr and a temperature of about 900° C. for about 10 minutes.

The Si substrate is preferably a P type Si substrate.

The hydrogen-containing gas stream is preferably pure $H_2$.

The constant flow rate of the silane-containing gas stream is preferably 12 sccm. The silane is preferably $SiH_4$.

The first period of time is preferably 2 minutes, and the gradually changing flow rate of the alkanes-containing gas stream is preferably increased from 0 sccm to 10 sccm by an increment of 2 sccm per minute.

The alkanes-containing gas stream is preferably $C_3H_8$ stream.

Furthermore, the second period of time and the third period of time are preferably 5 minutes respectively, and the SiC layer is preferably 5000 Å in thickness. The present invention may best be understood through the following description with reference to the accompanying drawings, in which:

BRIEF DESCRIPTION OF THE DRAWINGS

FIGS. 3 (a) & (b) are illustrations of I–V characteristics of N type SiC/P type Si heterojunction diode according to a conventional carbonization process and the present invention respectively;

FIGS. 4 (a) & (b) are illustrations of SEM sectional profiles of the SiC/Si heterojunctions according to the conventional carbonization process and the present invention respectively;

FIGS. 5 (a) & (b) are TEM sectional profiles of the SiC/Si heterojunctions formed by the method according to the conventional carbonization process and the present invention respectively;

DETAILED DESCRIPTION OF THE PREFERRED EMBODIMENT

Figure 2:
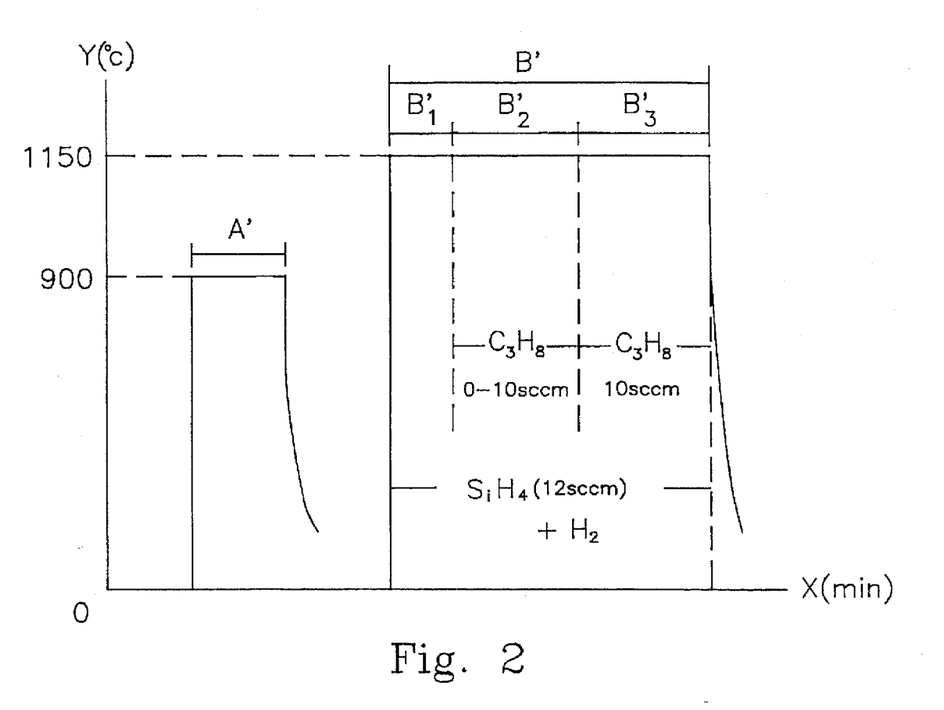
FIG. 2 is an illustration of the relationship between temperature, processing time, gas flow rate and species of gaseous reactant.

Referring to FIG. 2, a preferred embodiment of a graded-gap process according to the present invention is described below:

Step A': remove the surface oxide from a washed P type Si substrate which has a resistant coefficient of 3–5 Ω-cm in a chemical vapor deposition (C.V.D.) system or a rapid thermal C.V.D. (R.T.C.V.D.) system at a highly vacuumed surrounding having a pressure under $10^{-6}$ Torr and a temperature of 900° C. for 10 minutes;

Step B': heat the system until the temperature is 1150° C. and introduce an silane-containing gas stream which has a gradually changing flow rate to the Si substrate to grow an excellent SiC/Si heterojunction diode, wherein the alkanes-containing gas stream is preferred to be a $C_3H_8$ gas stream.

Figure 7:
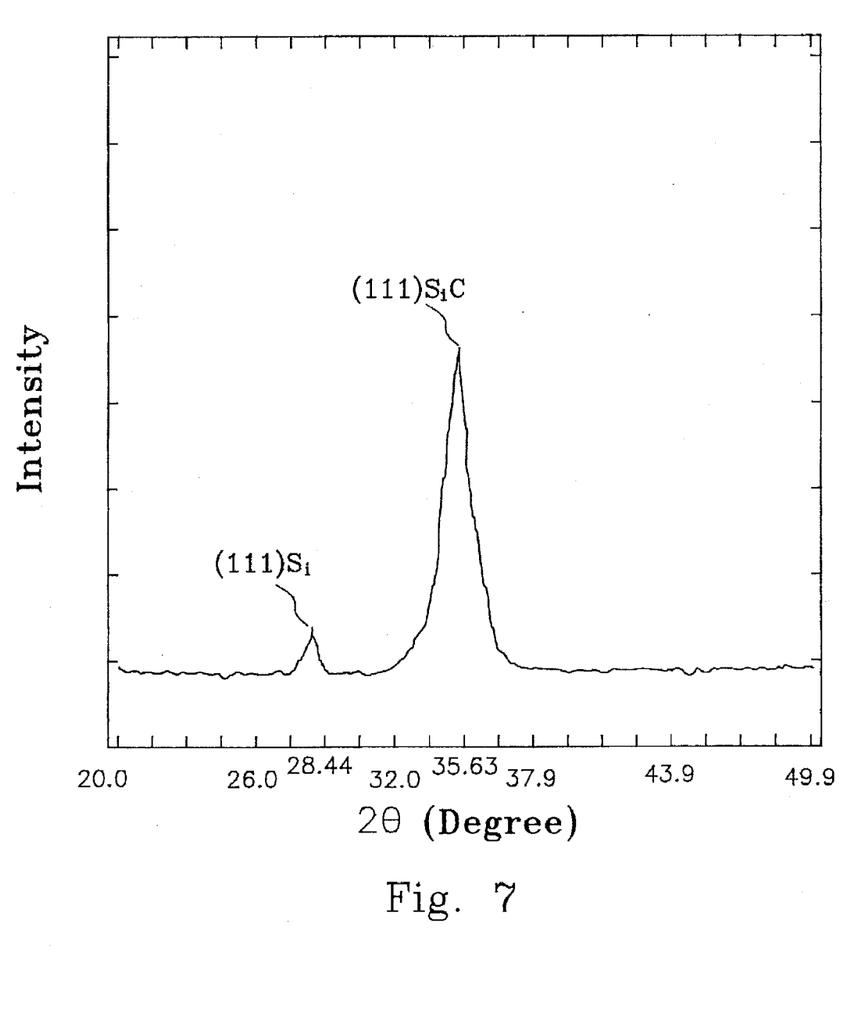
FIG. 7 is an illustration of X-ray diagram of the SiC/Si heterojunction according to the conventional carbonization method and the present invention respectively.

The (111)Si peak at 28.44° and the (111)SiC peak at 35.63° as shown in FIG. 7 indicate that a SiC/Si layer with excellent crystallinity is obtained according to the present invention.

Furthermore, the step B' includes sub-steps as follows:

step $B_1'$: introduce a hydrogen-containing gas stream (preferred to be a pure $H_2$ gas stream) and an alkanes-containing gas stream (preferred to be a $SiH_4$ gas stream) at a constant flow rate 12 sccm for 2 minutes;

step $B_2'$: introduce a $C_3H_8$ gas stream at an increasing flow rate from 0 sccm to 10 sccm by an increment of 2 sccm per minutes. Accordingly, the $C_3H_8$ gas stream reacts with the $SiH_4$ gas stream and the $H_2$ gas stream during the 5 minutes; and step $B_3'$: maintain the $C_3H_8$ gas stream at the constant flow rate 10 sccm to react with the $SiH_4$ and the $H_2$ gas streams for growing a SiC layer which is 5000 Å in thickness and has a graded band-gap. Thus an excellent SiC/Si heterojunction diode is obtained.

The flow rate of the $SiH_4$ gas stream is maintained at 12 sccm from step $B_1'$ to step $B_3'$.

The advantages of the present invention when compared with the conventional carbonization process are described below:

Referring to FIG. 1 and FIG. 2, which indicate that the complex carbonization and heating procedures are no more needed in the present invention, thus shortening the processing time and increasing the manufacture efficiency.

Furthermore, there exists several advantages in the SiC/Si junction of the diode according to the present invention while compared with the conventional process.

Figure 3A:
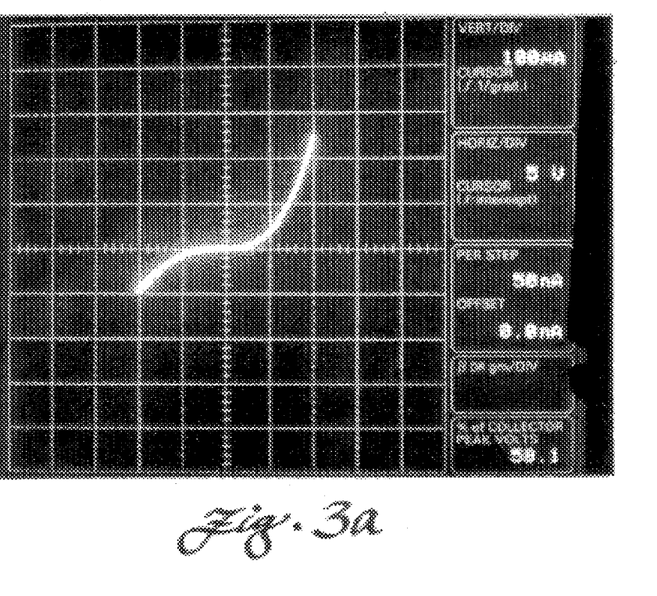
Figure 3B:
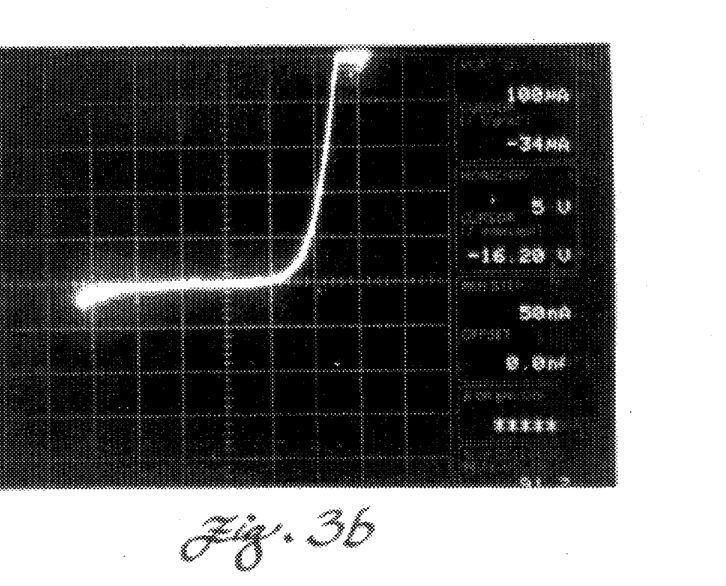

Referring to FIGS. 3 (a) & (b) which indicate the I–V characteristic curves of the N type SiC/P type Si heterojunction diodes according to the conventional carbonization process and according to the present invention, respectively, wherein the junction area of each diode is 9.1 mm² and each division in the X-axis and each division in the Y-axis represent 5 voltage and 100 μA, respectively.

Figure 4A:
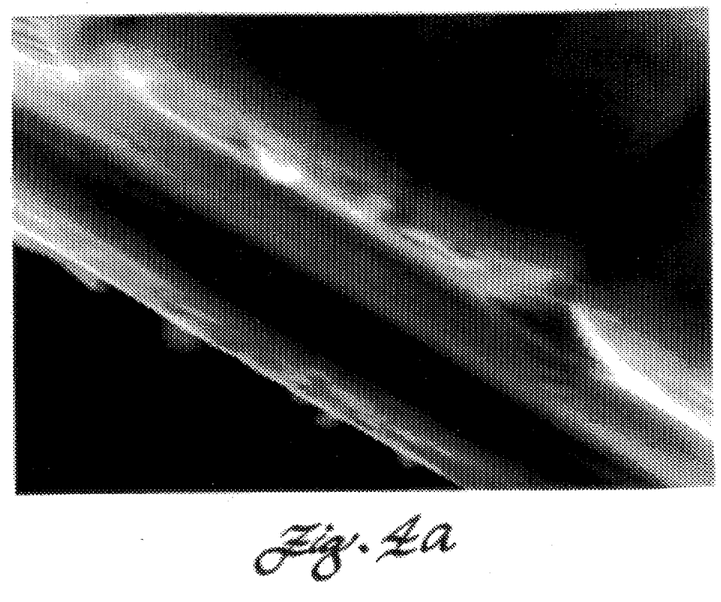
Figure 4B:
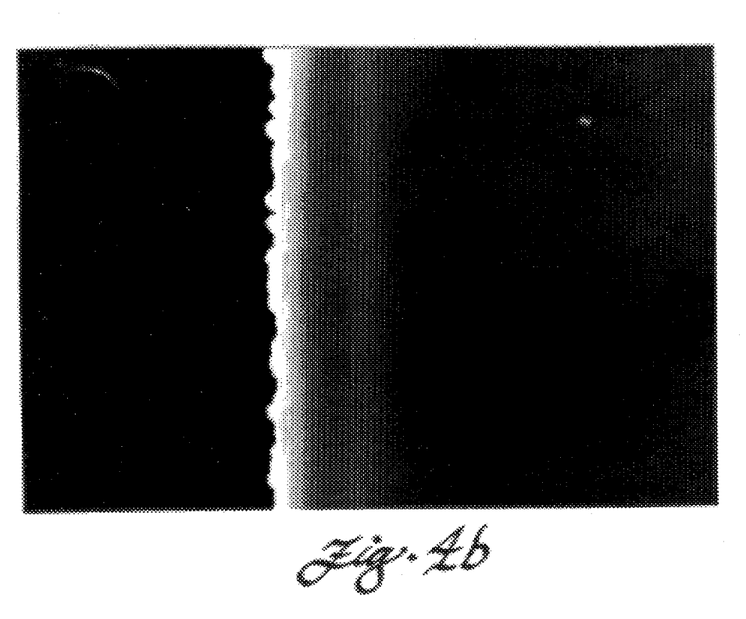

The reverse breakdown voltage of a SiC/Si heterojunction diode obtained from a conventional carbonization process, as shown in FIG. 3 (a), is 4 V and the leakage current density is $4\times10^{-4}$ A/cm² under a reverse bias voltage of 6.8 V. On the other hand, FIG. 3 (b) indicates that the diode according to the present invention shows a better rectifying character than those made by the conventional carbonization process, since it has a reverse breakdown voltage over 16 V, and a leakage current density of merely $3.74\times10^{-4}$ A/cm² under a reverse bias voltage of 16.2 V. Referring to FIGS. 4 (a) & (b), there are shown the sectional profiles by the scanning electron microscopy (SEM) for the SiC/Si heterojunction according to the conventional carbonization process and according to the present invention, respectively. FIG. 4 (a) indicates that there exists many voids 1 and cracks 2 in the junction while the junction shown in FIG. 4 (b) is very smooth with no defects.

Figure 5A:
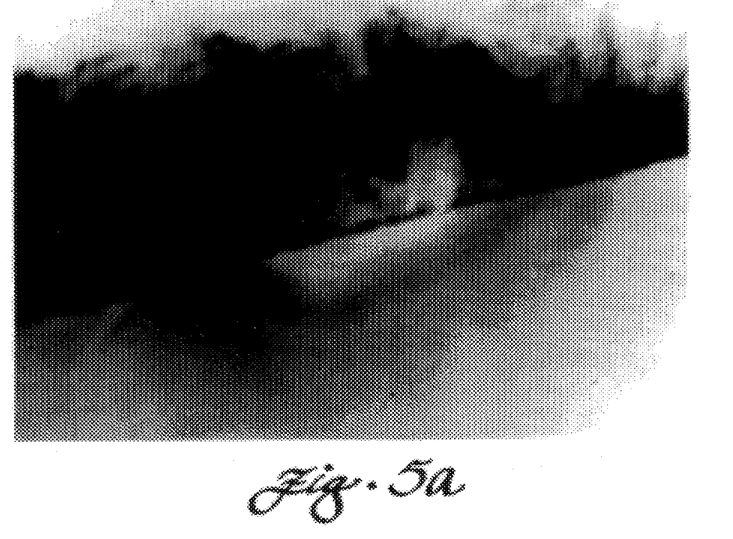
Figure 5B:
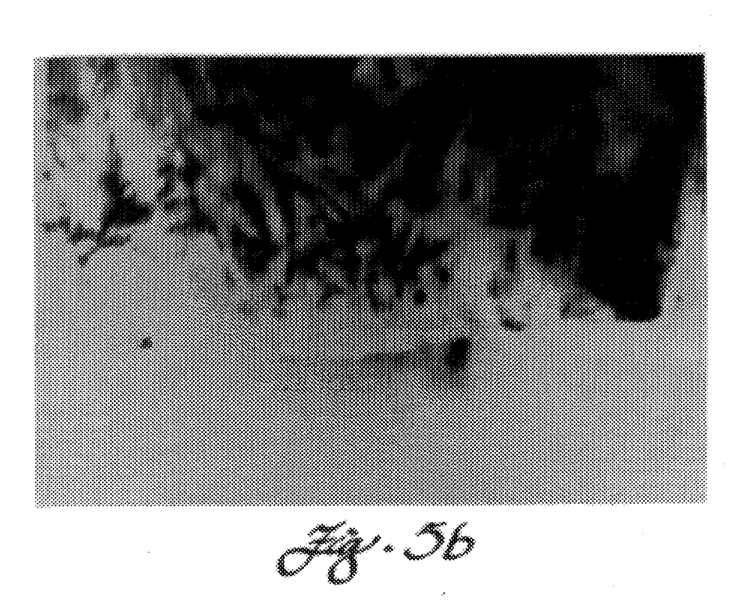

FIGS. 5 (a) & (b) are the sectional profiles by the transmission electron microscopy (TEM) for the SiC/Si heterojunction according to the conventional carbonization process and the present invention. There are voids 1 and dislocation 3 apparently indicated in FIG. 5 (a), which are absent in FIG. 5 (b).

Figure 6:
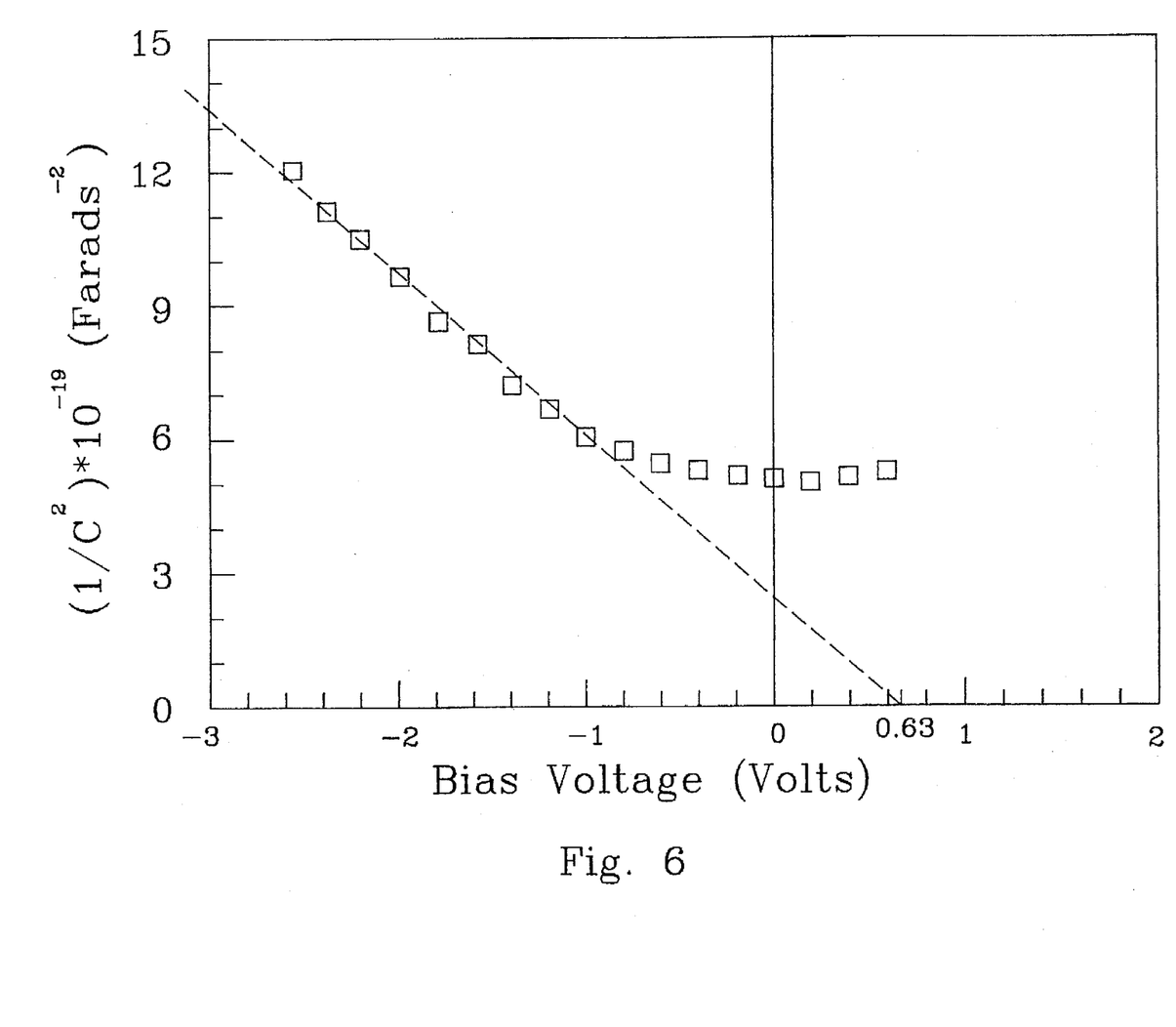
FIG. 6 is an illustration of the built-in voltage of a SiC/Si heterojunction diode according to the present invention.

The ($1/c^2$) vs. bias voltage diagram as illustrated in FIG. 6 shows that the built-in-voltage according to the present invention is 0.63 V, which is very close to the theoretical value 0.644 V.

Thus, the graded-gap process according to the present invention provides a low cost and more efficient manufacture method of the SiC/Si heterojunction which can be well applied to the production of heterojunction bipolar transister (HBT) or the other photoelectric elements and is of great commercial benefits.

While the invention has been described in terms of what are presently considered to be the most practical and preferred embodiments, it is to be understood that the invention need not be limited to the disclosed embodiment. On the country, it is intended to cover various modifications and similar arrangements included within the spirit and scope of the appended claims which are to be accorded with the broadest interpretation so as to encompass all such modifications and similar structures.

What is claimed is:

1. A graded-gap process for forming a SiC/Si heterojunction electrical element, comprising:

a) providing a Si substrate;

b) introducing a hydrogen containing gas stream to said Si substrate;

c) introducing a silane-containing gas stream of a constant flow rate to said Si substrate for reacting with said hydrogen-containing gas stream for a first period of time;

d) introducing an alkanes-containing gas stream of a gradually changing flow rate to said Si substrate for reacting with said hydrogen-containing gas stream and said silane-containing gas stream to grow a SiC layer on said Si substrate for a second period of time; and e) introducing said alkanes-containing gas stream at a constant flow rate for reacting with said hydrogen-containing gas stream and said silane-containing gas stream for a third period of time.

2. A graded-gap process according to claim 1 wherein said step c), d) and e) are executed at a constant temperature.

3. A graded-gap process according to claim 2 wherein said constant temperature is 1150° C.

4. A graded-gap process according to claim 1 wherein said substrate has a surface oxide thereof been removed before said hydrogen-containing gas stream is introduced.

5. A graded-gap process according to claim 2 wherein said surface oxide is removed in one of a chemical vapor deposition (C.V.D.) system and a rapid thermal C.V.D. (R.T.C.V.D.) system.

6. A graded-gap process according to claim 5 wherein said surface oxide is removed under a pressure of about $10^{-6}$ Torr and a temperature of about 900° C. for about 10 minutes.

7. A graded-gap process according to claim 1 wherein said Si substrate is a P type Si substrate.

8. A graded-gap process according to claim 5 wherein said hydrogen-containing gas stream is pure $H_2$.

9. A graded-gap process according to claim 1 wherein said constant flow rate of said silane-containing gas stream is 12 sccm.

10. A graded-gap process according to claim 1 wherein said silane is $SiH_4$.

11. A graded-gap process according to claim 1 wherein said first period of time is 2 minutes.

12. A graded-gap process according to claim 1 wherein said gradually changing flow rate of said alkanes-containing gas stream is increased from 0 sccm to 10 sccm by an increment of 2 sccm per minute.

13. A graded-gap process according to claim 1 wherein said alkanes-containing gas stream is $C_3H_8$ stream.

14. A graded-gap process according to claim 1 wherein said second period of time is 5 minutes.

15. A graded-gap process according to claim 1 wherein said third period of time is 5 minutes.

16. A graded-gap process according to claim 1 wherein said SiC layer is about 5000 Å in thickness.

* * * * *

UNITED STATES PATENT AND TRADEMARK OFFICE
CERTIFICATE OF CORRECTION

PATENT NO.    : 5,670,414
DATED         : September 23, 1997
INVENTOR(S)   : Y. K. Fang; J. D. Hwang It is certified that error appears in the above-identified patent and that said Letters Patent is hereby corrected as shown below:

Column 2,
Line 15, change "step c), d) and e)" to -- steps c), d) and e) --.
Line 17, replace "thereof been" with -- thereof being --.

Column 3,
Line 14, change "an silane-containing" to -- a silane-containing --.

Column 4,
Line 20, change "transister" to -- transistor --.
Line 27, change "country" to -- contrary --.
Line 53, change "step c), d) and e)" to -- steps c), d) and e) --.
Line 57, replace "thereof been" with -- thereof being --.

Signed and Sealed this

Sixth Day of November, 2001

*Attest:*

NICHOLAS P. GODICI
*Attesting Officer*     Acting Director of the United States Patent and Trademark Office